US012610509B2

(12) United States Patent
Schmid

(10) Patent No.: US 12,610,509 B2
(45) Date of Patent: Apr. 21, 2026

(54) COOLING DEVICE FOR COOLING AN ELECTRONIC COMPUTING DEVICE FOR A MOTOR VEHICLE, AND MOTOR VEHICLE

(71) Applicant: Bayerische Motoren Werke Aktiengesellschaft, Munich (DE)

(72) Inventor: Ludwig Schmid, Buch am Buchrain (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 190 days.

(21) Appl. No.: 18/422,844

(22) Filed: Jan. 25, 2024

(65) Prior Publication Data

US 2024/0260241 A1 Aug. 1, 2024

(30) Foreign Application Priority Data

Jan. 26, 2023 (DE) .................... 10 2023 101 875.2

(51) Int. Cl.
*H05K 7/20* (2006.01)
*H01M 10/42* (2006.01)
(Continued)

(52) U.S. Cl.
CPC ...... *H05K 7/20927* (2013.01); *H01M 10/425* (2013.01); *H01M 10/613* (2015.04);
(Continued)

(58) Field of Classification Search
CPC ............... H05K 7/20927; H05K 7/209; H05K 7/20872; H05K 7/20272; H05K 7/20218;
(Continued)

(56) References Cited

U.S. PATENT DOCUMENTS 5,865,531 A 2/1999 Frey et al.
7,082,033 B1 7/2006 Akram
(Continued)

FOREIGN PATENT DOCUMENTS

DE 88 12 632 U1 2/1989
DE 195 39 570 B4 4/1997
(Continued)

OTHER PUBLICATIONS

C1 German-language Search Report issued in German Application No. 10 2023 101 875.2 dated Nov. 6, 2023, with partial English translation (6 pages).

*Primary Examiner* — Adam B Dravininkas

(74) *Attorney, Agent, or Firm* — Crowell & Moring LLP

(57) ABSTRACT

A cooling device includes an electronic computing device where the electronic computing device has a housing with a receiving space and an electronic component disposed in the receiving space. A cooler is formed separately from the housing where the cooler is disposed at least partially in the receiving space, is connected to the housing, and has a first cooling channel which is disposed at least partially in the receiving space and through which a cooling medium is flowable for cooling a subregion of the electronic computing device. A connector is formed separately from the housing and separately from the cooler, where the connector has a (Continued)

second cooling channel through which the cooling medium is flowable and which is fluidically connected to the first cooling channel.

10 Claims, 2 Drawing Sheets

(51) Int. Cl.

| | |
|---|---|
| *H01M 10/613* | (2014.01) |
| *H01M 10/625* | (2014.01) |
| *H01M 10/6568* | (2014.01) |
| *B60L 50/60* | (2019.01) |

(52) U.S. Cl.
CPC ..... *H01M 10/625* (2015.04); *H01M 10/6568* (2015.04); *B60L 50/60* (2019.02); *H01M 2010/4271* (2013.01); *H01M 2220/20* (2013.01)

(58) Field of Classification Search
CPC ........... H01M 10/613; H01M 2220/20; H01M 10/625; H01M 10/6568; H01M 10/6556; H01M 10/6567; H01M 10/6557
See application file for complete search history.

(56) References Cited

U.S. PATENT DOCUMENTS

| | | | | |
|---|---|---|---|---|
| 11,435,013 | B2 * | 9/2022 | West | B64D 37/32 |
| 2011/0261531 | A1 * | 10/2011 | Hirashima | H05K 7/20927 |
| | | | | 361/689 |
| 2013/0229770 | A1 * | 9/2013 | Franz | G06F 1/206 |
| | | | | 361/679.53 |
| 2014/0096930 | A1 * | 4/2014 | Krug, Jr | F24F 11/64 |
| | | | | 138/90 |
| 2017/0067589 | A1 * | 3/2017 | Ishikawa | F28F 3/08 |
| 2017/0370504 | A1 * | 12/2017 | Li | F16L 41/086 |
| 2023/0261565 | A1 * | 8/2023 | Du | H02M 1/327 |
| | | | | 361/689 |
| 2023/0318393 | A1 * | 10/2023 | Defoy | F25B 31/02 |
| | | | | 310/54 |

FOREIGN PATENT DOCUMENTS

| | | |
|---|---|---|
| DE | 102 33 836 A1 | 2/2004 |
| DE | 10 2008 013 604 B4 | 9/2009 |
| DE | 10 2009 054 517 B4 | 6/2011 |
| DE | 10 2013 104 627 B3 | 9/2014 |
| DE | 10 2015 118 146 A1 | 4/2017 |
| DE | 10 2018 214 570 A1 | 3/2020 |
| DE | 10 2020 100 360 A1 | 7/2021 |

* cited by examiner

COOLING DEVICE FOR COOLING AN ELECTRONIC COMPUTING DEVICE FOR A MOTOR VEHICLE, AND MOTOR VEHICLE

CROSS REFERENCE TO RELATED APPLICATION

This application claims priority under 35 U.S.C. § 119 from German Patent Application No. 10 2023 101 875.2, filed Jan. 26, 2023, the entire disclosure of which is herein expressly incorporated by reference.

BACKGROUND AND SUMMARY

The invention relates to a cooling device for cooling at least one subregion of an electronic computing device for a motor vehicle. The invention furthermore relates to a motor vehicle having such a cooling device.

DE 10 2009 054 517 B4 discloses an electronic control unit consisting of a housing, in which at least one circuit board is arranged. At least one electronic component is arranged on the circuit board, the electronic component comprising means for shielding electrical and/or magnetic fields. U.S. Pat. No. 7,082,033 B1 discloses a method. Furthermore, DE 10 2008 013 604 B4 discloses an apparatus for cooling an electronic control unit for the open-loop and/or closed-loop control of a lighting device for a motor vehicle. DE 8812632 U1 discloses a cooling apparatus for a control unit for arrangement on a structural part. DE 102 33 836 A1 discloses an electronic control unit. Moreover, DE 195 39 570 B4 discloses a headlamp for vehicles.

An object of the present invention is to provide a cooling device for cooling at least one subregion of an electronic computing device for a motor vehicle and a motor vehicle having such a cooling device, so that at least the subregion of the electronic computing device, also referred to as control unit, can be cooled in a particularly advantageous way.

A first aspect of the invention relates to a cooling device for cooling at least one subregion of an electronic computing device, also referred to as control unit, for a motor vehicle, also simply referred to as vehicle. This means that the motor vehicle, which is preferably in the form of a motor car, in particular a passenger motor car, comprises the cooling device in its fully produced state. The cooling device comprises the electronic computing device. In other words, the electronic computing device is a component of the cooling device. For example, the electronic computing device can be used to operate, that is to say for example control in open-loop and/or closed-loop fashion, at least one constituent part of the motor vehicle. To this end, for example, the electronic computing device may provide at least one in particular electrical actuating signal, with the constituent part being able to receive the actuating signal. The actuating signal can be used to operate, that is to say for example control in open-loop and/or closed-loop fashion, the constituent part. The electronic computing device and thus the cooling device has a housing, which is also referred to as device housing or first housing. When mention is made above and below to the housing, it is to be understood to mean the first housing, unless stated otherwise. The housing has a receiving space. In particular, the receiving space is delimited by the housing, in particular directly. The receiving space is also referred to as first receiving space. When mention is made above and below to the receiving space, it is to be understood to mean the first receiving space, unless stated otherwise. The electronic computing device also comprises at least one electronic component arranged in the receiving space. For example, the electronic computing device comprises at least one circuit board, with the electronic component being arranged on the circuit board and in particular being borne with the circuit board. In this case, the circuit board is arranged in the receiving space and thus in the housing. In addition, the cooling device comprises at least one cooler, which is formed separately from the housing, is arranged at least partially, in particular at least predominantly and thus at least more than halfway or else completely in the receiving space and thus in the housing, and is connected to the housing at least indirectly, in particular directly. This means that the housing and the cooler are interconnected elements that are formed separately from one another. The cooler comprises at least one first cooling channel, which is arranged at least partially in the receiving space and thus in the housing and through which a preferably liquid cooling medium can flow. Very preferably, the cooling medium is a constituent part of the cooling device. For example, the cooling medium is a liquid, and therefore the cooling medium is also referred to as cooling liquid. In particular, the first cooling channel is delimited by an inner-circumferential lateral surface of the cooler, in particular directly. The cooling medium can be used to cool at least the subregion of the electronic computing device, in particular in that heat from the subregion can be transferred to the cooling medium flowing in particular through the first cooling channel, in particular via the cooler.

The cooling device moreover comprises a connector formed separately from the housing and separately from the cooler. This means that the housing, the cooler and the connector are elements formed separately from one another. The cooler is also referred to as cooling element. The connector has a second cooling channel, through which the cooling medium can flow and which is fluidically connected to the first cooling channel. As a result, the cooling medium can flow through the first cooling channel and the second cooling channel. If the connector is for example in the form of a supply connector, the cooling medium can be supplied to the first cooling channel via the second cooling channel and thus via the connector, with the result that the second cooling channel is arranged or extends upstream of the first cooling channel in the flow direction of the cooling medium flowing through the cooling channels. If the connector is for example in the form of a discharge or return connector, the cooling medium for example can be discharged from the first cooling channel via the second cooling channel and thus via the connector, with the result that the first cooling channel is arranged upstream of the second cooling channel in the flow direction of the cooling medium flowing through the cooling channels. Cooling the electronic computing device makes it possible to avoid overheating of the electronic computing device, with the result that, for example, a high performance of the electronic computing device can be ensured even at high external or ambient temperatures.

In order then to be able to cool at least the subregion of the electronic computing device in a particularly advantageous way, it is intended according to the invention for the connector to have a first part, which is arranged in the receiving space and thus in the housing and also in a first length region of the first cooling channel and forms, in particular delimits, and very particularly directly delimits, a second length region of the second cooling channel. In addition, the connector has a second part, which is arranged outside the receiving space, outside the housing and outside the cooler. In particular, the second part is arranged in a surrounding area of the housing. The second part forms a third length region of the second cooling channel, with for example the third length region of the second cooling channel being delimited by the second part, in particular directly. This means that the second length region of the second cooling channel and the third length region of the second cooling channel are fluidically connected to each other, so that the cooling medium can flow through the second length region and the third length region. In principle, it would be conceivable for the parts of the connector to be formed separately from one another and interconnected. It is also conceivable for the parts of the connector to be formed in one piece, and therefore formed from a single piece. In other words, it is conceivable for the parts of the connector to be formed in one piece, with the result that the parts of the connector are not in the form of interconnected parts formed separately from one another, but instead the parts preferably are formed from a single piece and thus formed by a monoblock or in the form of a monoblock. The monoblock is a one-piece, and therefore an integrally produced, integral body, which is not composed for instance of interconnected elements formed separately from one another, but instead is formed in one piece, that is to say is formed from a single piece.

The first part of the connector has a first thread, in particular an external thread, which is screwed, in particular directly, to a second thread, in particular an internal thread, arranged in the first longitudinal region of the first cooling channel. For example, the first thread is screwed in the second thread, in particular directly. The first thread of the connector is a dedicated thread of the connector and is therefore also referred to as intrinsic thread of the connector.

A first region of the first part is sealed with respect to the cooler in a first sealing plane. For this, for example, the first region of the first part has a first sealing surface, and for example the cooler has a second sealing surface, with the first sealing surface being sealed with respect to the second sealing surface. For example, provision is made of a first sealing element, which is formed separately from the cooler and separately from the connector and by means of which, for example, the first sealing surface is sealed with respect to the second sealing surface and thus the first region of the first part of the connector is sealed with respect to the cooler in the first sealing plane. Very particularly, the first sealing element may be a solid body, it being possible for the first sealing element to be made, for example, of an elastically deformable material, in particular a rubber. For example, the first sealing element is in the form of a first sealing ring, in particular a first O ring. It would also be conceivable for the first sealing element to be a liquid seal, in particular a first sealing paste.

According to the invention, it is moreover provided that a second region, spaced apart from the first region, of the second part of the connector is sealed with respect to a component of the cooling device in a second sealing plane which is spaced apart from the first sealing plane and extends, for example, parallel to the first sealing plane. To this end, for example, the first region has a third sealing surface and the component has a fourth sealing surface, it being the case for example that the third sealing surface is sealed with respect to the fourth sealing surface. For example, provision is made of a second sealing element, which is formed separately from the connector and separately from the component and also separately from the first sealing element and by means of which for example the third sealing surface is sealed with respect to the fourth sealing surface and thus the second region of the second part of the connector is sealed with respect to the component. It is conceivable for the second sealing element to be in the form of a solid body. For example, the second sealing element is made of an elastically deformable material, in particular a rubber. For example, the second sealing element may be a second sealing ring, in particular a second O ring. It is also conceivable for the second sealing element to be in the form of a second liquid seal, in particular a second sealing paste. For example, the first sealing surface is formed by an outer-circumferential lateral surface of the first region, and for example the second sealing surface is formed by an outer-circumferential or inner-circumferential lateral surface of the cooler. For example, the third sealing surface is formed by an outer-circumferential lateral surface of the second region. For example, the fourth sealing surface is formed by an outer-circumferential or inner-circumferential lateral surface of the component. For example, the first sealing element rests, in particular directly, against the first region, in particular against a first sealing surface. For example, the first sealing element rests, in particular directly, against the cooler, in particular against a second sealing surface. For example, the second sealing element rests, in particular directly, against the second region, in particular against a third sealing surface. For example, the second sealing element rests, in particular directly, against the component, in particular against a fourth sealing surface. The invention makes it possible to particularly advantageously seal the connector, which for example is in the form of a cooler connector or is also referred to as cooler connector, with respect to the cooler and with respect to the component in the two sealing planes in a way which is favorable in terms of structural space, weight and costs. The connector is sealed with respect to the cooler in the first length region of the first cooling channel and thus in the cooler, in the receiving space and thus in the housing. The connector is sealed with respect to the component outside the receiving space, outside the first cooling channel, outside the cooler and outside the housing. It is also possible in the case of the invention for the cooling medium to be conducted advantageously and as required, resulting in effective and efficient cooling at least of the subregion of the electronic computing device. Moreover, the cooling device can be mounted and thus produced particularly advantageously and, in the process, in particular especially favorably in terms of time and costs, in particular in that the cooler can be connected to the housing easily and thus favorably in terms of time and costs. Moreover, the connector can be mounted favorably in terms of time and costs and, in the process, in particular sealed with respect to the cooler and with respect to the component. The invention also enables active cooling of the electronic computing device by the cooling medium. Active cooling is to be understood to mean that the cooling medium, also referred to as coolant, flows through the cooling channels and in so doing dissipates heat at least from the subregion and thus cools the subregion. For example, the cooling channels are arranged in a cooling circuit, through which the cooling medium can flow and in which for example a pump can be arranged. The pump is for example an electrically operable pump. The pump can be used to convey the cooling medium through the cooling circuit and thus through the cooling channels. The cooling medium makes it possible to effectively and efficiently dissipate waste heat from the subregion and thus from the electronic computing device, in particular conduct the waste heat out of the electronic computing device.

The connector, in particular the second part of the connector, may for example be connected or connectable, in particular nondestructively detachably, to a line element which is formed separately from the connector and through which the cooling medium can flow. In particular, the line element extends at least partially outside the receiving space and thus outside the housing and outside the cooler. Preferably, the line element is formed separately from the housing and separately from the cooler. For example, the connector, in particular the second part of the connector, is in the form of a quick-action coupling, in particular a VDA quick-action coupling, with the result that the line element can be both mechanically and fluidically connected to the connector particularly easily and favorably in terms of time and costs, in particular in that the line element is plugged onto the connector, in particular onto the second part. Usually, such connectors are always placed on a direct seal relative to the cooler, in particular in the first sealing plane mentioned. An additional sealing plane, such as the aforementioned second sealing plane, can usually only be formed with considerable outlay and in particular only using additional structural parts. If the connector does not have an intrinsic thread and for example is fastened to the housing in such a way that at least one screw penetrates the connector, in particular the flange of the connector, and is screwed to the housing, particularly large screw openings would be necessary for this, since tolerances exist both between the cooler and the housing and between the connector and the housing. It would also be conceivable to fasten the connector to the housing by means of a clip or clamp formed separately from the housing and separately from the connector, in such a way that the clip or the clamp is fastened to the housing by means of an additional, separate screw element and in the process presses the connector, in particular via its flange, against the housing. This would, however, lead to a high number of structural parts and a high structural space requirement. By contrast, the invention then intends for the connector to have a dedicated thread in the form of the first thread, and therefore the first thread of the connector is also referred to as intrinsic thread of the connector.

Preferably, the first thread is an external thread, with the second thread corresponding to the first thread preferably being an internal thread. In particular, the threads are directly screwed to each other, in particular directly screwed one in the other. This makes it possible to seal the connector both with respect to the housing and with respect to the cooler in the two sealing planes favorably in terms of structural space, weight and costs. In comparison with conventional solutions, the structural space requirement and the number of parts can be kept to a particularly small scale.

In one embodiment of the invention, the component is a housing element of the housing that at least partially, in particular directly, delimits the receiving space, with the result that in this embodiment it is provided that the second region of the second part of the connector is sealed with respect to the housing in the receiving space of which the cooler is arranged. This makes it possible to realize effective and efficient cooling of the electronic computing device particularly favorably in terms of structural space.

In this respect, it has been found to be particularly advantageous if the cooler is connected, in particular directly, to the housing element of the housing. For example, the cooler is screwed and thus connected to the housing element by means of at least one or more screw elements, which are formed separately from the cooler and separately from the housing element.

It has been found to be particularly advantageous if the component is a housing element, which is formed separately from the housing, is provided in addition to the housing (first housing) and is arranged outside the housing and outside the receiving space, of a second housing, which is formed separately from the housing, is provided in addition to the housing and is arranged outside the housing and outside the receiving space, of the cooling device. This makes it possible to arrange the housing elements relative to one another especially as required and favorably in terms of structural space, with it being possible to realize particularly advantageous conduction of the cooling medium favorably in terms of structural space, with the result that at least the subregion of the electronic computing device can be cooled effectively and efficiently and also favorably in terms of structural space.

In another, particularly advantageous embodiment of the invention, the second housing is a store housing of an electrical energy store, in which or by means of which electrical energy is to be stored or is stored, in particular by electrochemical means. Very preferably, the electrical energy store is a high-voltage element whose voltage, in particular operating or nominal voltage, is preferably greater than 50 volts, in particular greater than 60 volts, and very preferably several hundred volts. The electrical energy store is therefore for example also referred to as high-voltage store (HVS). For example, the motor vehicle in its fully produced state comprises at least one electrical machine, which can be used to electrically, in particular fully electrically, drive the motor vehicle. Preferably, it is provided that the electric machine is a high-voltage element whose voltage, in particular operating or nominal voltage, is preferably greater than 50 volts, in particular greater than 60 volts, and very preferably several hundred volts. For example, the electric machine can be supplied with the electrical energy stored in the electrical energy store, as a result of which the electric machine can be operated in motor mode and thus as an electric motor. The motor vehicle can be driven electrically, in particular fully electrically, by means of the electric motor. Since the motor vehicle can preferably be driven by means of the electric machine, the electric machine is also referred to as traction machine. Since the electric machine is supplied with the electrical energy stored in the energy store and thus can be operated as an electric motor, the energy store is for example also referred to as traction store or traction battery. In this respect, the invention enables effective cooling of the subregion of the electronic computing device favorably in terms of structural space, weight and costs, since advantageous conduction of the cooling medium can be realized. Therefore, the cooler can advantageously be supplied with the cooling medium via the connector and/or the cooling medium can particularly advantageously be discharged from the cooler via the connector.

The second housing has a second receiving space, which is arranged outside the first housing and outside the first receiving space and is delimited, in particular directly, by the second housing. Storage cells of the electrical energy store that are designed for storing the electrical energy are accommodated in the second receiving space. This means that the electrical energy can be stored or is stored by the storage cells, which are also referred to simply as cells. Preferably, the storage cells are electrically connected to one another.

It has been found to be particularly advantageous in this respect if the first housing is connected, in particular directly, to the second housing. This makes it possible to keep the structural space requirement, the number of parts and the costs to a particularly small scale. For example, the housings can rest against one another, in particular directly.

Another embodiment is distinguished in that the electronic computing device is in the form of a battery management system (BMS) of the electrical energy store, so that, for example, the electrical energy store can be operated, in particular controlled in open-loop or closed-loop fashion, by means of the electronic computing device. Consequently, for example, the aforementioned constituent part is the electrical energy store. In this case, the electronic computing device can be cooled particularly effectively and efficiently and also favorably in terms of structural space, weight and costs.

In order to keep the structural space requirement particularly low and to be able to realize particularly advantageous conduction of the cooling medium, another embodiment of the invention intends for the second housing to have a through-opening, through which the connector passes.

Lastly, it has been found to be particularly advantageous if the second part of the connector has a tool engagement portion, by means of which a torque can be transferred in form-fitting fashion between the connector and a screwing tool to screw the threads to each other. Preferably, the tool engagement portion is unround or polygonal, in particular in the form of an internal polygon or external polygon. The polygon may for example be a square or a hexagon. This makes it possible to rotate the connector particularly easily relative to the cooler, with the result that the first thread can be rotated easily relative to the second thread. The connector can therefore be mounted favorably in terms of time and costs, so that it is possible to cool the electronic computing device particularly favorably in terms of costs.

A second aspect of the invention relates to a motor vehicle, which is also referred to simply as vehicle and for example motor car, in particular passenger motor car and which comprises at least one cooling device according to the first aspect of the invention. Advantages and advantageous configurations of the first aspect of the invention can be considered to be advantages and advantageous configurations of the second aspect of the invention, and vice versa.

Further details of the invention will emerge from the following description of preferred exemplary embodiments with the associated drawings.

DETAILED DESCRIPTION OF THE DRAWINGS

In the figures, elements which are the same or have the same function are denoted by the same reference signs.

Figure 1:
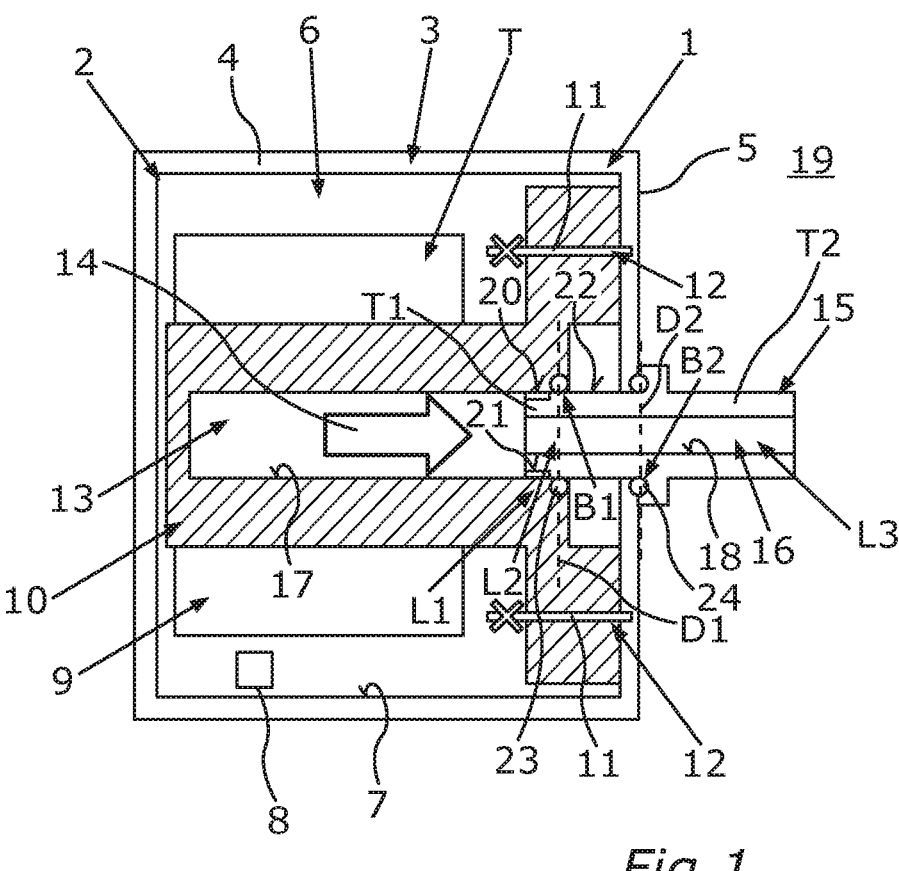
FIG. 1 shows a schematic and sectional side view of a first embodiment of a cooling device for cooling at least one subregion of an electronic computing device for a motor vehicle.

FIG. 1 shows a schematic and sectional side view of a first embodiment of a cooling device 1 for cooling at least one subregion T of an electronic computing device 2 for a motor vehicle, also referred to simply as vehicle. This means that the motor vehicle in its fully produced state comprises the cooling device 1. The cooling device 1 comprises the electronic computing device 2, which is therefore a constituent part of the cooling device 1. An element which is not illustrated in FIG. 1 and is provided in addition to the electronic computing device 2 can be operated, that is to say in particular controlled in open-loop or closed-loop fashion, by means of the electronic computing device 2. The electronic computing device 2 is also referred to as control unit. The control unit has a housing 3, which is also referred to as first housing or main housing. The housing 3 may for example comprise at least or exactly two interconnected housing elements, specifically a first housing element 4 and a second housing element 5, which are formed separately from one another. The housing 3 has a receiving space 6, which is also referred to as first receiving space and is delimited, in particular directly delimited, by the housing 3, in particular by an inner-circumferential lateral surface 7 of the housing 3.

It can be seen in FIG. 1 that the receiving space 6 is delimited partially by the housing element 4 and partially by the housing element 5, in particular directly in each case The subregion T to be cooled is arranged in the receiving space 6 and thus in the housing 3. The electronic computing device 2 has at least one electronic component 8, especially schematically illustrated in FIG. 1, which is arranged in the receiving space 6 and thus in the housing 3 and may be arranged for example in the subregion T, with the result that for example the electronic component 8 can be cooled. Especially schematically illustrated in FIG. 1 is an element 9, arranged in the subregion T and thus to be cooled, of the electronic computing device 2, with it being possible for the element 9 to be or comprise the electronic component 8. The cooling device 1 comprises a cooler 10, which is formed separately from the housing 3 and is arranged in the receiving space 6 and thus in the housing 3. In this respect, the cooler 10 is connected to the housing element 5 and thus to the housing 3, in particular inside the receiving space 6. Screw elements 11, which are formed separately from the cooler 10 and separately from the housing 3, in the present case are arranged at least partially in the receiving space 6, and by means of which the cooler 10 is connected to the housing element 5 and thus to the housing 3, are provided for this. The respective screw element 11 is a screw, for example. The respective screw element 11 passes through a corresponding, for example threadless through-opening 12 in the cooler 10. The cooler 10 comprises at least one first cooling channel 13, which is arranged and thus extends in the receiving space 6 and through which a preferably liquid cooling medium can flow. The cooling medium is also referred to as coolant. In FIG. 1, a flow of the cooling medium through the first cooling channel 13 is depicted by an arrow 14. Via the cooler 10, heat can be transferred from the subregion T, in particular the element 9, to the cooling medium flowing through the first cooling channel 13, as a result of which the subregion T, in particular the element 9, is cooled. It can be seen that the subregion T can be cooled by means of the cooling medium in that the cooling medium can transport this heat away from the subregion T.

The cooling device 1 moreover comprises a connector 15, which is formed separately from the housing 3 and separately from the cooler 10 and is also referred to as cooling connector or cooler connector. The connector 15 has a second cooling channel 16, through which the cooling medium can flow and which is fluidically connected to the first cooling channel 13.

It can be seen in FIG. 1 that, for example, the first cooling channel 13 is delimited, in particular directly, by an inner-circumferential lateral surface 17 of the cooler 10. As an alternative or in addition, the second cooling channel 16 is delimited, in particular directly, by an inner-circumferential lateral surface 18 of the connector 15. In the exemplary embodiment shown in FIG. 1, the connector 15 by way of example is a return or discharge connector, via which the cooling medium can be discharged from the cooler 10. This means that the first cooling channel 13 is arranged upstream of the second cooling channel 16 in the flow direction of the cooling medium flowing through the cooling channels 13 and 16. However, this is only by way of example. As an alternative, the connector 15 could be a supply connector, via which the cooling medium can be supplied to the cooler 10, that is to say the cooling channel 13. In that case, the cooling channel 16 would be arranged upstream of the cooling channel 13 in the flow direction of the cooling medium flowing through the cooling channels 13 and 16.

In order then to be able to particularly advantageously realize effective and efficient cooling at least of the subregion T of the electronic computing device 2, in the case of the cooling device 1 it is provided that the connector 15 has a first part T1, which is arranged in the receiving space 6 and in a first length region L1 of the cooling channel 13 and forms, in particular delimits and very particularly directly delimits, a second length region L2 of the second cooling channel 16. In addition, the connector 15 has a second part T2, which is arranged outside the receiving space 6, outside the housing 3 and outside the cooler 10, in particular is arranged in a surrounding area 19 of the housing 3, and forms, in particular delimits and very particularly directly delimits, a third length region L3 of the second cooling channel 16. In this case, the third length region L3 extends for example outside the receiving space 6, outside the housing 3 and outside the cooler 10 and in particular in the surrounding area 19.

The first part T1 of the connector 15 has a first thread 20, which in the present case is in the form of an external thread. The first length region L1 of the first cooling channel 13 has a second thread 21, which corresponds to the first thread 20 and in the present case is in the form of an internal thread. The threads 20 and 21 are directly screwed to each other, that is to say directly screwed one in the other, in the present case in such a way that the thread 20 is screwed directly in the thread 21. As a result, the connector 15 is screwed, in particular directly, to the cooler 10. Since the thread 20 is a thread of the connector 15, the thread 20 is also referred to as intrinsic thread of the connector 15. Since the threads 20 and 21 and thus the connector 15 and the cooler 10 are screwed, in particular directly, to each other, inside the receiving space 6 the connector 15 is connected, in particular directly, to the cooler 10.

It can also be seen in FIG. 1 that a first region B1 of the first part T1 of the connector 15 is sealed with respect to the cooler 10 in a first sealing plane D1. For this, the first region B1 has a first sealing surface, which is formed by an outer-circumferential lateral surface 22 of the region B1. The cooler 10 has a second sealing surface, which is formed by an inner-circumferential lateral surface of the cooler 10. In this case, the second sealing surface is sealed with respect to the second sealing surface. A first sealing element 23, which is preferably in the form of a solid body, is provided for this. In the first embodiment shown in FIG. 1, the first sealing element 23 is in the form of a sealing ring, in particular an O ring. For example, the first sealing element 23 is made of an elastically deformable material, in particular a rubber. The first region B1, in particular the first sealing surface, is supported against the cooler 10, in particular against the second sealing surface, by means of the first sealing element 23, for example in such a way that the first sealing element 23 rests both against the first sealing surface, in particular directly, and against the second sealing surface, in particular directly, and thus both directly against the region B1 and directly against the cooler 10.

A second region B2, spaced apart from the first region B1 in particular in the flow direction of the cooling medium flowing through the cooling channels 13 and 16, of the second part T2 of the connector 15 is sealed with respect to a component of the cooling device 1 in a second sealing plane D2, which is spaced apart from the first sealing plane D1 in particular in the flow direction of the cooling medium flowing through the cooling channels 13 and 16. In the first embodiment, the component is the housing element 5 of the first housing 3 that at least partially, in particular directly, delimits the receiving space 6. For example, the second region B2 of the connector 15 is a third sealing surface, which is spaced apart from the first sealing surface and the second sealing surface in particular in the flow direction of the cooling medium flowing through the cooling channels 13 and 16 and is formed for example by the outer-circumferential lateral surface 22 of the connector 15. Moreover, for example, the housing element 5 has a fourth sealing surface, which is spaced apart in particular from the first sealing surface and the second sealing surface and also from the third sealing surface and is formed in particular by an inner-circumferential or outer-circumferential lateral surface of the housing element 5. In this case, the third sealing surface is sealed with respect to the fourth sealing surface. For example, a second sealing element 24, which is provided in addition to the first sealing element 23 and is formed separately from the first sealing element 23, is provided. Preferably, the second sealing element 24 is a solid body. For example, the second sealing element 24 is made of an elastically deformable material, in particular a rubber. In the first embodiment shown in FIG. 1, the second sealing element 24 is for example a second sealing ring, in particular a second O ring. The second region B2, in particular the third sealing surface, is sealed with respect to the housing element 5, in particular with respect to the fourth sealing surface, by means of the second sealing element 24, for example in such a way that the second sealing element 24 rests both against the region B2, in particular against the third sealing surface, in particular directly, and against the housing element 5, in particular against the fourth sealing surface, in particular directly. It can be seen in FIG. 1 that the region B1 is sealed with respect to the cooler 10 radially, that is to say in the radial direction of the connector 15. This is in particular to be understood to mean that the first sealing surface and the second sealing surface are situated opposite each other along a first sealing direction, with the first sealing direction extending obliquely or, in the present case, perpendicularly to the flow direction of the cooling medium flowing through the cooling channel 16. The region B2 is sealed with respect to the housing element 5 radially, that is to say in the radial direction, and/or axially, that is to say in the axial direction. This means that, for example, the third sealing surface and the fourth sealing surface are situated opposite each other along a second sealing direction and/or along a third sealing direction, with the second sealing direction extending obliquely or perpendicularly to the flow direction of the cooling medium flowing through the cooling channel 16, so that as a result radial sealing of the region B2 with respect to the housing element 5 is provided. The third sealing direction extends in the axial direction, that is to say parallel to the flow direction of the cooling medium flowing through the cooling channel 16. This is provided for example in such a way that, for example, a first part of the third sealing surface and a second part of the fourth sealing surface are situated opposite each other along the second sealing direction. As an alternative or in addition, for example, a third part of the third sealing surface and a fourth part of the fourth sealing surface are situated opposite each other along the third sealing direction. In this respect, it is conceivable for the second sealing element 24 to rest against the first part of the third sealing surface and against the second part of the fourth sealing surface, in particular in each case directly. As an alternative or in addition, for example, the second sealing element 24 rests against the third part of the third sealing surface and against the fourth part of the fourth sealing surface, in particular in each case directly. It can be seen that the sealing planes D1 and D2 are spaced apart from each other axially, that is to say in the flow direction of the cooling medium flowing through the cooling channel 16. Moreover, for example, the respective sealing plane D1, D2 extends perpendicularly to the flow direction of the cooling medium flowing through the cooling channel 16.

In the first embodiment, the first sealing element 23 is a radial seal, by means of which the region B1 is radially sealed with respect to the cooler 10.

Since in the present case the threads 20 and 21 are directly screwed to one another, that is to say directly screwed one in the other, a direct screwed connection of the connector 15 to the cooler 10 is provided. This direct screwed connection makes it possible to avoid additional, separate connecting elements. Moreover, additional, separate attachment points can be avoided, as a result of which the structural space requirement, the number of parts, the weight and the costs can be kept to a particularly low scale.

Figure 2:
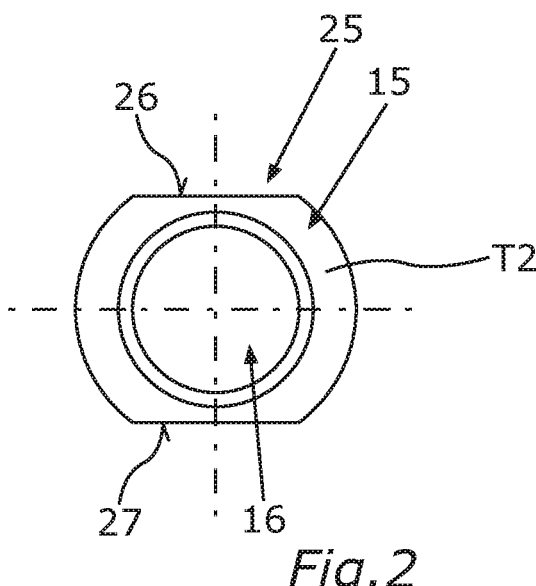
FIG. 2 shows a schematic front view of a first embodiment of a connector of the cooling device.

FIG. 2 shows a schematic front view of a first embodiment of the connector 15. In the first embodiment of the connector 15 shown in FIG. 2, with it being possible for the first embodiment of the connector 15 shown in FIG. 2 to be used in the first embodiment of the cooling device 1 shown in FIG. 1, the second part T2 and thus the connector 15 have a tool engagement portion 25, which, in the first embodiment of the connector 15 shown in FIG. 2, has two oppositely situated flat surfaces 26 and 27 facing away from each other and extending in mutually parallel and spaced-apart planes. The tool engagement portion 25 can be used to transfer a torque in form-fitting fashion between the connector 15 and a screwing tool, formed separately from the connector 15, to screw the threads 20 and 21 to each other. In the first embodiment of the connector 15 shown in FIG. 2, the tool engagement portion 25 is in the form of what is referred to as an outer-circumferential wrench width. As an alternative to this, an inner wrench width would be conceivable.

Figure 3:
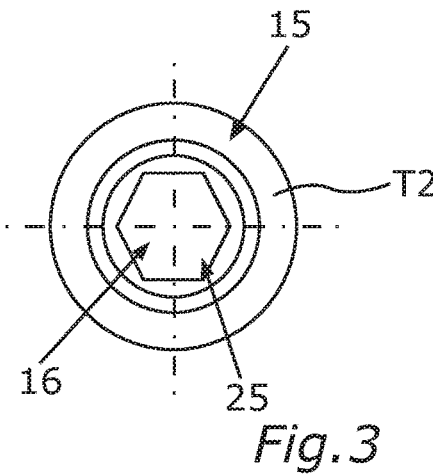
FIG. 3 shows a schematic front view of a second embodiment of the connector.

FIG. 3 shows a schematic front view of a second embodiment of the connector 15. The second embodiment of the connector 15 can be used in the first embodiment of the cooling device 1. In the second embodiment, the tool engagement portion 25 of the second part T2 is in the form of an internal polygon, in the present case an internal hexagon.

Figure 4:
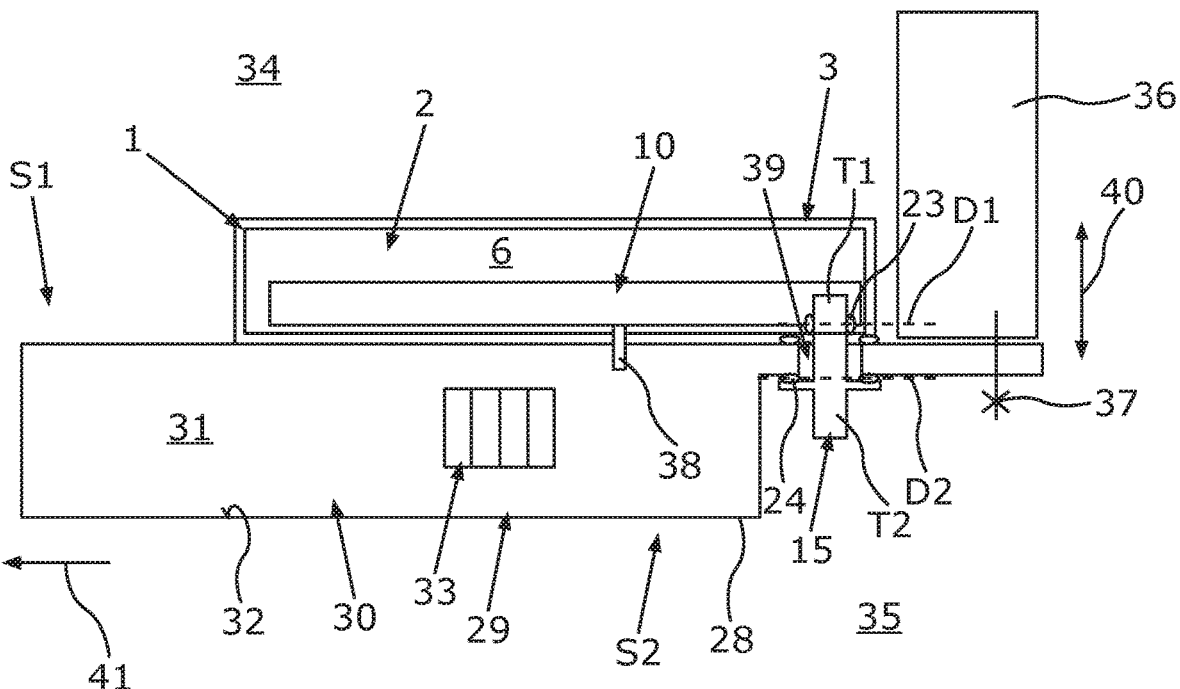
FIG. 4 shows a schematic and partially sectional side view of a second embodiment of the cooling device.

FIG. 3 shows a schematic and partially sectional side view of a second embodiment of the cooling device 1. In the second embodiment, the component, with respect to which the second region B2 of the second part T2 of the connector 15 is sealed in the second sealing plane D2, is a housing element 28, which is formed separately from the housing 3, is provided in addition to the housing 3 and is arranged outside the housing 3 and outside the receiving space 6, of a second housing 29, which is formed separately from the housing 3, is provided in addition to the housing 3 and is arranged outside the housing 3 and outside the receiving space 6, of an electrical energy store 30 of the cooling device 1 and thus of the motor vehicle. The second housing 29 is also referred to as store housing and has a second receiving space 31, which is arranged outside the first housing 3 and outside the first receiving space 6 and is delimited, in particular directly, by the housing 29, in particular by an inner-circumferential lateral surface 32 of the housing 29. Storage cells 33, which are especially schematically illustrated in FIG. 4, of the energy store 30 are arranged in the second receiving space 31, and electrical energy can be stored or is stored in the storage cells 33, in particular by electrochemical means. The motor vehicle, also referred to simply as vehicle, has an interior space 34, which is also referred to as passenger cell or passenger compartment, which can hold people, such as the driver of the motor vehicle, in particular during a journey of the motor vehicle. A surrounding area of the motor vehicle overall is denoted 35 in FIG. 4, with the surrounding area 35 of the motor vehicle being a surrounding area of the electrical energy store 30. In the second embodiment shown in FIG. 4, the electronic computing device 2 is a battery management system (BMS) of the energy store 30, which is operated, in particular controlled in open-loop or closed-loop fashion, by means of the battery management system. The interior space 34 of the motor vehicle is formed by a structure 36, a detail of which can be seen in FIG. 4, of the motor vehicle and the structure 36 is preferably in the form of a self-contained vehicle body. It can be seen in FIG. 4 that the store housing (second housing 29) is at least indirectly, in particular directly, fastened to the structure 36. In the present case, the store housing and thus the energy store 30 are screwed against the structure 36 and thus fastened to the structure 36. Screw elements, by means of which the store housing and thus the energy store 30 are screwed against the structure 36 and thus fastened to the structure 36, are provided for this. One of these screw elements, by means of which the store housing and thus the energy store 30 are screwed against the structure 36, which is denoted 37 and especially schematically illustrated can be seen in FIG. 4. Also especially schematically illustrated in FIG. 4 is an electrical connection 38, by means of which the electronic computing device 2 is electrically connected to the energy store 30. For example, the connection 38 is in the form of a high-voltage connection.

It can also be seen in FIG. 4 that the second housing 29 (store housing) has a through-opening 39, through which the connector 15 passes. The housing 3 in this case is arranged on a first side S1 of the second housing 29, with the first side S1 facing upward in the vertical direction of the motor vehicle in the installed position of the energy store 30. The energy store 30 assumes its installed position in the fully produced state of the motor vehicle that comprises the energy store 30, the installed position being shown in FIG. 4. The vehicle vertical direction is depicted by a double-headed arrow 40 in FIG. 4. The direction of forward travel, extending in the longitudinal direction of the motor vehicle, of the motor vehicle, which can move forward in its direction of forward travel, is depicted by an arrow 41. It can be seen that the housing 3 and the cooler 10 and the receiving space 6 are arranged, in particular in each case completely, on the side S1. Therefore, the first part T1 of the connector 15 is at least partially arranged on the first side S1, with the connector 15 extending for example from the first side S1 through the through-opening 39 and extending on a second side S2 of the store housing (second housing 29). In this case, the second side S2 faces away from the first side S1, in the present case the second side S2 facing downward in the vertical direction of the motor vehicle in the installed position of the energy store 30. The second part T2 of the connector 15 is at least partially arranged on the second side S2, with the second region B2 being sealed with respect to the component (second housing 29) on the second side S2. In this case, the sealing planes D1 and D2 are spaced apart from each other in the vertical direction (double-headed arrow 40) of the motor vehicle. In both the first embodiment and the second embodiment, a structural space requirement for the connector 15 can be kept particularly low. Additional, separate connecting elements for attaching the connector 15 can be avoided, with the result that it is also possible to avoid additional attachment points for such connecting elements. This makes it possible to keep the structural space requirement, the number of parts and thus the weight and the costs to a particularly small scale.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LIST OF REFERENCE CHARACTERS

1 Cooling device
2 Electronic computing device
3 Housing
4 Housing element
5 Housing element
6 Receiving space
7 Inner-circumferential lateral surface
8 Electronic component
9 Constituent part
10 Cooler
11 Screw element
12 Through-opening
13 First cooling channel
14 Arrow
15 Connector
16 Second cooling channel
17 Inner-circumferential lateral surface
18 Inner-circumferential lateral surface
19 Surrounding area
20 First thread
21 Second thread
22 Outer-circumferential lateral surface
23 First sealing element
24 Second sealing element
25 Tool engagement portion
26 Surface
27 Surface
28 Housing element
29 Second housing
30 Electrical energy store
31 Second receiving space
32 Inner-circumferential lateral surface
33 Storage cells
34 Interior space
35 Surrounding area
36 Structure
37 Screw element
38 Connection
39 Through-opening
40 Double-headed arrow
41 Arrow
B1 First region B2 Second region
D1 First sealing plane
D2 Second sealing plane
L1 First length region
L2 Second length region
S1 First side
S2 Second side
T Subregion
T1 First part
T2 Second part

What is claimed is:

1. A cooling device, comprising:
an electronic computing device, wherein the electronic computing device has a first housing with a first receiving space and an electronic component disposed in the first receiving space;
a cooler, wherein the cooler is formed separately from the first housing, wherein the cooler is disposed at least partially in the first receiving space, is connected to the first housing, and has a first cooling channel which is disposed at least partially in the first receiving space and through which a cooling medium is flowable for cooling a subregion of the electronic computing device; and
a connector, wherein the connector is formed separately from the first housing and separately from the cooler, wherein the connector has a second cooling channel through which the cooling medium is flowable and which is fluidically connected to the first cooling channel;
wherein the connector has a first part which is disposed in the first receiving space and in a first length region of the first cooling channel and forms a second length region of the second cooling channel;
wherein the connector has a second part which is disposed outside the first receiving space, outside the first housing, and outside the cooler and forms a third length region of the second cooling channel;
wherein the first part of the connector has a first thread which is screwed to a second thread disposed in the first length region of the first cooling channel;
wherein a first region of the first part is sealed with respect to the cooler in a first sealing plane;
wherein a second region, spaced apart from the first region, of the second part is sealed with respect to a component of the cooling device in a second sealing plane spaced apart from the first sealing plane.

2. The cooling device according to claim 1, wherein the component of the cooling device is a first housing element of the first housing that at least partially delimits the first receiving space.

3. The cooling device according to claim 2, wherein the cooler is connected to the first housing element of the first housing.

4. The cooling device according to claim 1, wherein the component of the cooling device is a second housing element, which is formed separately from the first housing and is disposed outside the first housing and outside the first receiving space, of a second housing, which is formed separately from the first housing and is disposed outside the first housing and outside the first receiving space.

5. The cooling device according to claim 4, wherein the second housing is a store housing of an electrical energy store and delimits a second receiving space, which is disposed outside the first housing and outside the first receiving space and which accommodates storage cells of the electrical energy store that are configured to store electrical energy.

6. The cooling device according to claim 5, wherein the first housing is connected to the second housing.

7. The cooling device according to claim 5, wherein the electronic computing device is in a form of a battery management system of the electrical energy store.

8. The cooling device according to claim 5, wherein the second housing has a through-opening through which the connector passes.

9. The cooling device according to claim 1, wherein the second part of the connector has a tool engagement portion via which a torque is transferrable between the connector and a screwing tool to screw the first thread and the second thread to each other.

10. A motor vehicle, comprising:
the cooling device according to claim 1.

* * * * *